US011469219B1

(12) United States Patent
Yang

(10) Patent No.: US 11,469,219 B1
(45) Date of Patent: Oct. 11, 2022

(54) DUAL DIE SEMICONDUCTOR PACKAGE AND MANUFACTURING METHOD THEREOF

(71) Applicant: NANYA TECHNOLOGY CORPORATION, New Taipei (TW)

(72) Inventor: Wu-Der Yang, Taoyuan (TW)

(73) Assignee: NANYA TECHNOLOGY CORPORATION, New Taipei (TW)

( * ) Notice: Subject to any disclaimer, the term of this patent is extended or adjusted under 35 U.S.C. 154(b) by 8 days.

(21) Appl. No.: 17/243,208

(22) Filed: Apr. 28, 2021

(51) Int. Cl.
| | |
|---|---|
| *H01L 25/065* | (2006.01) |
| *H01L 23/31* | (2006.01) |
| *H01L 23/13* | (2006.01) |
| *H01L 23/498* | (2006.01) |
| *H01L 21/48* | (2006.01) |
| *H01L 25/00* | (2006.01) |
| *H01L 21/56* | (2006.01) |

(52) U.S. Cl.
CPC ...... *H01L 25/0657* (2013.01); *H01L 21/4853* (2013.01); *H01L 21/565* (2013.01); *H01L 23/13* (2013.01); *H01L 23/3107* (2013.01); *H01L 23/49838* (2013.01); *H01L 25/50* (2013.01); *H01L 2225/0651* (2013.01); *H01L 2225/06517* (2013.01); *H01L 2225/06558* (2013.01); *H01L 2225/06572* (2013.01); *H01L 2225/06586* (2013.01)

(58) Field of Classification Search
CPC ............. H01L 25/0657; H01L 21/4853; H01L 21/565; H01L 23/13; H01L 23/3107; H01L 23/49838
See application file for complete search history.

(56) References Cited

U.S. PATENT DOCUMENTS

| | | | | |
|---|---|---|---|---|
| 9,972,558 | B1* | 5/2018 | Talledo | ............... H01L 21/4825 |
| 11,362,066 | B2* | 6/2022 | Chen | ....................... H01L 24/08 |
| 2009/0250822 | A1* | 10/2009 | Chen | ................... H01L 25/0657 |
| | | | | 257/E23.141 |
| 2016/0322340 | A1 | 11/2016 | Li et al. | |
| 2018/0269188 | A1* | 9/2018 | Yu | ........................ H01L 23/3128 |
| 2019/0355637 | A1* | 11/2019 | Chen | ..................... H01L 23/562 |

(Continued)

FOREIGN PATENT DOCUMENTS

| | | |
|---|---|---|
| TW | 201036138 A1 | 10/2010 |
| TW | 202022955 A | 6/2020 |
| TW | 202101701 A | 1/2021 |

*Primary Examiner* — Thao P Le
(74) *Attorney, Agent, or Firm* — Muncy, Geissler, Olds & Lowe, P.C.

(57) ABSTRACT

The present application provides a semiconductor package and a manufacturing method for the semiconductor package. The semiconductor package includes a package substrate, a first semiconductor die, a second semiconductor die, a first encapsulant and a second encapsulant. The package substrate has a first side and a second side facing away from the first side, and the second side has a concave recessed from a planar portion of the second side. The first semiconductor die is attached to the first side of the package substrate. The second semiconductor die is attached to a recessed surface of the concave. The first encapsulant covers the first side of the package substrate and encapsulates the first semiconductor die. The second encapsulant fills up the concave and encapsulates the second semiconductor die.

20 Claims, 20 Drawing Sheets

(56) References Cited

U.S. PATENT DOCUMENTS

| | | | | |
|---|---|---|---|---|
| 2020/0381397 | A1* | 12/2020 | Yu | H01L 24/08 |
| 2021/0233852 | A1* | 7/2021 | Yu | H01L 23/5385 |
| 2021/0305210 | A1* | 9/2021 | Yang | H01L 23/3128 |
| 2021/0351162 | A1* | 11/2021 | Yang | H01L 25/0657 |
| 2021/0407942 | A1* | 12/2021 | Yu | H01L 24/19 |
| 2022/0165673 | A1* | 5/2022 | Chang Chien | H01L 24/19 |
| 2022/0189959 | A1* | 6/2022 | Yang | H01L 27/0805 |

* cited by examiner

DUAL DIE SEMICONDUCTOR PACKAGE AND MANUFACTURING METHOD THEREOF

TECHNICAL FIELD

The present disclosure relates to a semiconductor package and a manufacturing method thereof, and more particularly, to a dual-die semiconductor package and a manufacturing method thereof.

DISCUSSION OF THE BACKGROUND

Recent development in electronics have been toward more compact semiconductor packages. To satisfy the demand for smaller and thinner semiconductor packages, semiconductor packages that contain multiple semiconductor dies ("multi-die packages") have been developed. Multi-die packages are used in a wide variety of applications, such as in laptop computers and cellular phones. As compared to single-die packages, multi-die packages have the advantages of miniaturization, low weight and high mounting density.

Multi-die packages can be classified as stacking type packages or parallel-aligning type packages. A stacking type package includes semiconductor dies stacked on a package substrate, while a parallel-aligning type package includes semiconductor dies disposed side-by-side on a package substrate. The stacking type packages reduce mounting area, while the parallel-aligning type packages simplify the manufacturing process and reduce package thickness. However, for either the stacking type packages or the parallel-aligning type packages, routing paths from the semiconductor dies to the inputs/outputs (I/Os) are inconsistent. Such inconsistency may result in signal delay for certain semiconductor die(s) (e.g., the top semiconductor die in a stacking type package), and may limit the operation frequency of the semiconductor packages.

This Discussion of the Background section is provided for background information only. The statements in this Discussion of the Background are not an admission that the subject matter disclosed in this section constitutes prior art to the present disclosure, and no part of this Discussion of the Background section may be used as an admission that any part of this application, including this Discussion of the Background section, constitutes prior art to the present disclosure.

SUMMARY

In an aspect of the present disclosure, a semiconductor package is provided. The semiconductor package comprises: a package substrate with a first side and a second side facing away from the first side, wherein the second side has a concave recessed from a planar portion of the second side; a first semiconductor die, attached to the first side of the package substrate; a second semiconductor die, attached to a recessed surface of the concave; a first encapsulant, covering the first side of the package substrate and encapsulating the first semiconductor die; and a second encapsulant, filling up the concave and encapsulating the second semiconductor die.

In another aspect of the present disclosure, a semiconductor package is provided. The semiconductor package comprises: a package substrate with a first side and a second side facing away from the first side, wherein the second side has a concave recessed from a planar portion of the second side; a first semiconductor die, attached to the first side of the package substrate, wherein an active surface of the first semiconductor die faces toward the package substrate; and a second semiconductor die, attached to a recessed surface of the concave and overlapped with the first semiconductor die, wherein an active surface of the second semiconductor die faces toward the recessed surface of the second side of the package substrate.

In yet another aspect of the present disclosure, a manufacturing method of a semiconductor package is provided. The method comprises: providing a package substrate with a first side and a second side opposite to the first side; removing a portion of the package substrate from the second side, to form a concave having a recessed surface recessed from a planar portion of the second side of the package substrate; attaching a first semiconductor die to the first side of the package substrate; attaching a second semiconductor die to the recessed surface of the concave; encapsulating the first semiconductor die with a first encapsulant; and filling a second encapsulant into the concave to encapsulate the second semiconductor die.

The foregoing has outlined rather broadly the features and technical advantages of the present disclosure in order that the detailed description of the disclosure that follows may be better understood. Additional features and advantages of the disclosure will be described hereinafter, and form the subject of the claims of the disclosure. It should be appreciated by those skilled in the art that the conception and specific embodiment disclosed may be readily utilized as a basis for modifying or designing other structures or processes for carrying out the same purposes of the present disclosure. It should also be realized by those skilled in the art that such equivalent constructions do not depart from the spirit and scope of the disclosure as set forth in the appended claims.

BRIEF DESCRIPTION OF THE DRAWINGS

Aspects of the present disclosure are best understood from the following detailed description when read with the accompanying figures. It should be noted that, in accordance with the standard practice in the industry, various features are not drawn to scale. In fact, the dimensions of the various features may be arbitrarily increased or reduced for clarity of discussion.

DETAILED DESCRIPTION

Figure 1A:
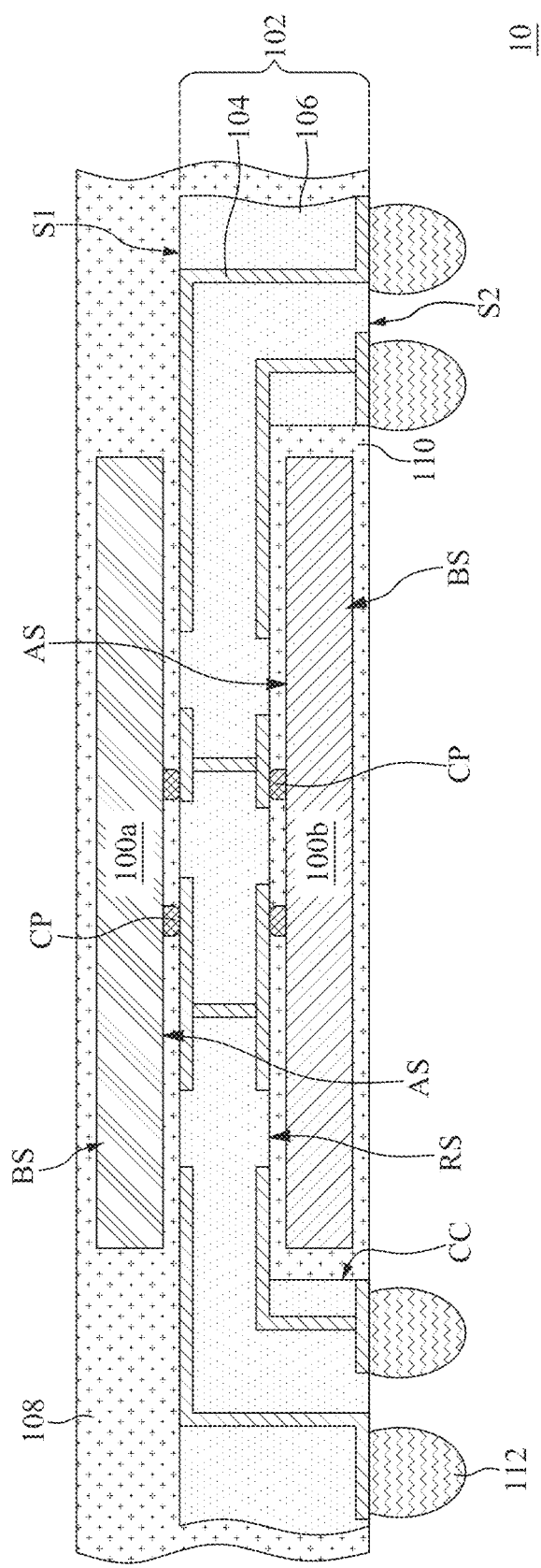
FIG. 1A is a schematic cross-sectional view illustrating a semiconductor package according to some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The semiconductor package to be described is a multi-die semiconductor package in which multiple semiconductor dies are bonded to a package substrate. It should be noted that, "die" or "dies" refers to piece(s) of a device wafer and is used interchangeably with "chip" or "chips".

FIG. 1A is a schematic cross-sectional view illustrating a semiconductor package 10 according to some embodiments of the present disclosure.

Referring to FIG. 1A, the semiconductor package 10 is a dual-die semiconductor package that includes a first semiconductor die 100a and a second semiconductor die 100b. In some embodiments, the first and second semiconductor dies 100a, 100b may respectively be a memory die, such as a dynamic random access memory (DRAM) die. However, in alternative embodiments, one or both of the first and second semiconductor dies 100a, 100b may be semiconductor die(s) with other functionality, such as processor die(s), analog die(s), application-specific integrated circuit (ASIC) die(s) or the like. The present disclosure is not limited to functionality of each of the semiconductor dies 100a, 100b.

The first and second semiconductor dies 100a, 100b are attached to a package substrate 102. The semiconductor substrate 102 is embedded with circuits 104 for out-routing the first and second semiconductor dies 100a, 100b to, for example, a main board (not shown). The circuits 104 are formed in a stack of dielectric layers 106 (collectively depicted as a single layer in FIG. 1A), and includes conductive traces 104a and conductive vias 104b. The conductive traces 104a and the conductive vias 104b are formed of a conductive material, such as copper. The conductive traces 104a each laterally runs along a top surface of one of the dielectric layers 106, while the conductive vias 104b each vertically penetrates through one or more of the dielectric layers 106 to electrically connect vertically separated ones of the conductive traces 104a. In some embodiments, the dielectric layers 106 are build-up polymer films, such as Ajinomoto build up polymer films Although not shown, in some embodiments, a dielectric core layer is inserted in the stack of dielectric layers 106. In these embodiments, the circuits 104 spread at opposite sides of the dielectric core layer and are connected via conductive through holes (also not shown) penetrating through the dielectric core layer. The dielectric core layer may be formed of a polymer material, such as epoxy. In alternative embodiments, the package substrate 102 is a core-less package substrate, and the package substrate 102 may have a rather small thickness.

Figure 1B:
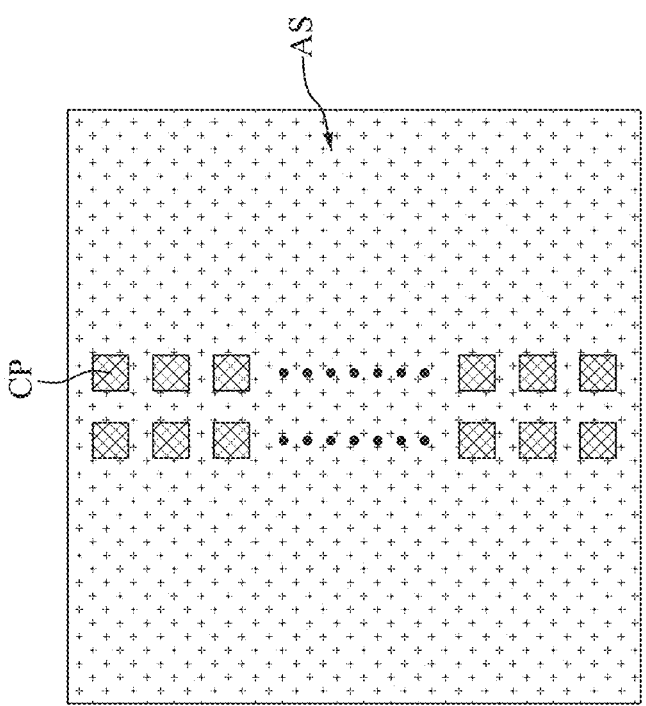
FIG. 1B is a schematic plan view illustrating an active surface of each semiconductor die, according to some embodiments of the present disclosure.

FIG. 1B is a schematic plan view illustrating an active surface AS of each semiconductor die (i.e., each of the first and second semiconductor dies 100a, 100b), according to some embodiments of the present disclosure.

Referring to FIG. 1A and FIG. 1B, each semiconductor die 100a/100b has an active surface AS and a back surface BS (labeled in FIG. 1A) facing away from the active surface AS. The active surface AS may be an outermost surface of material layers formed on a front surface of a semiconductor substrate (e.g., a silicon substrate). An integrated circuit, such as a memory integrated circuit, is formed in these material layers. Electrical connectors CP, which may be functioned as inputs/outputs (I/Os) of the integrated circuit, may be topmost conductive patterns in the material layers, and exposed at the active surface AS. In those embodiments where each semiconductor die 100a/100b is attached to the package substrate 102 via a flip-chip bonding manner, the electrical connectors CP may be bumps, conductive pillars, conductive pillar bumps or the like, and may be protruded from a planar portion of the active surface AS. However, in alternative embodiments, the electrical connectors CP are formed as conductive pads, and may or may not protrude from the planar portion of the active surface AS. The present disclosure is not limited to types of the electrical connectors CP. Further, in some embodiments, as shown in FIG. 1B, the electrical connectors CP are formed within a central region of the active surface AS. In these embodiments, the electrical connectors CP may be arranged along one or more columns (e.g., along two columns) in the central region of the active surface AS. In alternative embodiments, the electrical connectors CP may be arranged along edges of the active surface AS (e.g., left and right edges of the active surface AS shown in FIG. 1B). The present disclosure is not limited to the arrangement of the electrical connectors CP. On the other hand, the back surface BS of each semiconductor die 100a/100b may be defined by a back surface of the semiconductor substrate, and may be free of electrical connectors.

Referring to FIG. 1A, in some embodiments, the first semiconductor die 100a is attached to a front side S1 of the package substrate 102 via a flip-chip bonding manner In these embodiments, the active surface AS of the attached first semiconductor die 100a faces toward the front side S1 of the package substrate 102. In addition, the electrical connectors CP at the active surface AS of the first semiconductor die 100 are attached to portions of the circuits 104 exposed at the front side S1 of the package substrate 102, so as to establish electrical connection between the integrated circuit in the first semiconductor die 100a and the circuits 104 in the package substrate 102. In some embodiments, an underfill (not shown) spreads between the active surface AS of the first semiconductor die 100a and the front side S1 of the package substrate 102, and laterally surrounds the electrical connectors CP. On the other hand, the back surface BS of the first semiconductor die 100a faces away from the front side S1 of the package substrate 102.

Figure 1C:
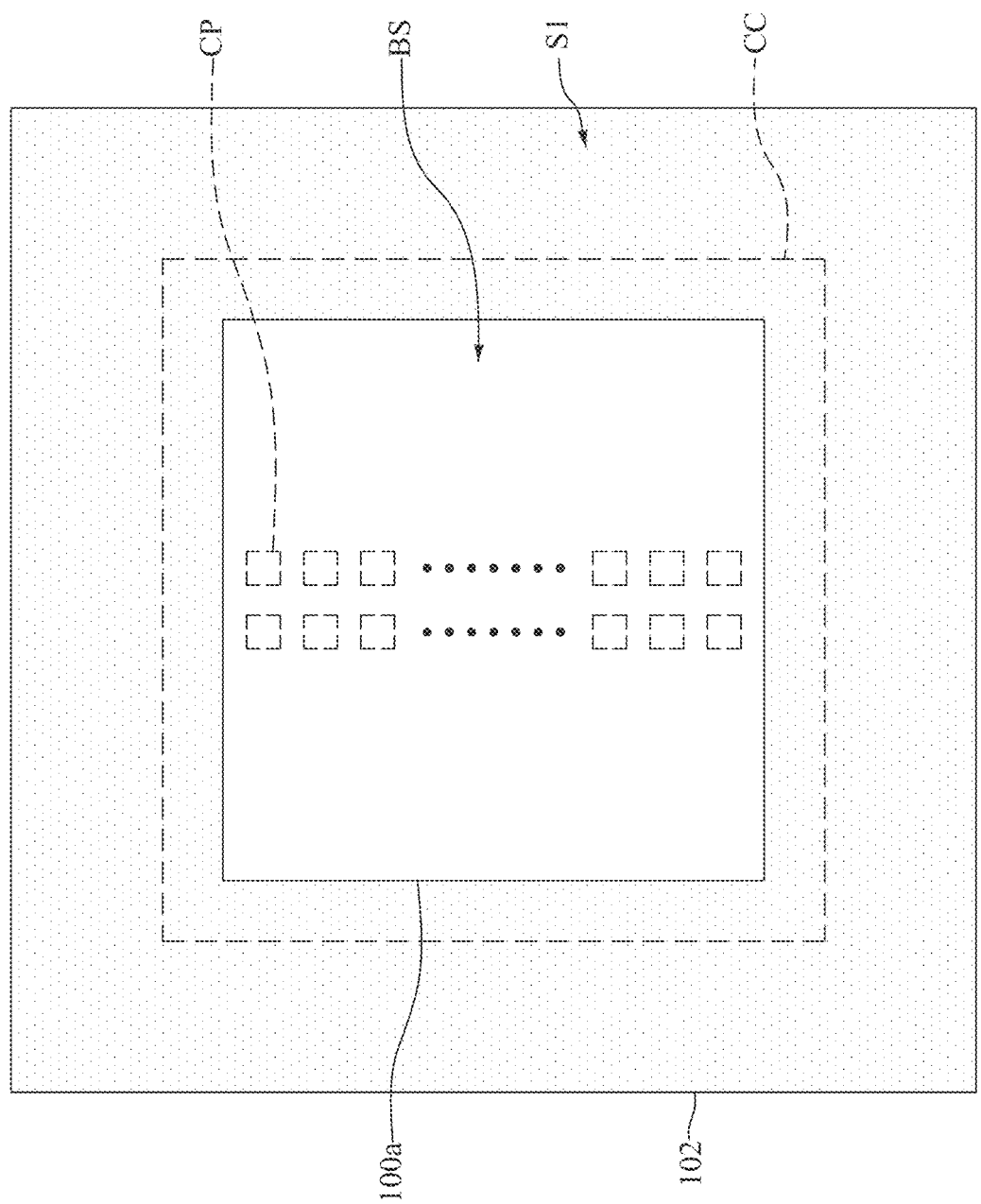
FIG. 1C is a schematic plan view illustrating a configuration of the first semiconductor die and the package substrate at a top side of the semiconductor package, according to some embodiments of the present disclosure.

FIG. 1C is a schematic plan view illustrating a configuration of the first semiconductor die 100a and the package substrate 102 at a top side of the semiconductor package 10, according to some embodiments of the present disclosure.

Referring to FIG. 1A and FIG. 1C, in those embodiments where the first semiconductor die 100a is attached to the package substrate 102 via a flip-chip bonding manner, the active surface AS of the first semiconductor die 100a faces toward the package substrate 102, thus the electrical connectors CP at the active surface AS are depicted by ghost lines in FIG. 1C. As shown in FIG. 1C, the first semiconductor die 100a may be disposed within a central region of the package substrate 102, but the present disclosure is not limited thereto. In some embodiments, a ratio of a footprint area of the package substrate 102 over a footprint area of the first semiconductor die 100a is greater than 1, but less than about 2. In these embodiments, if there are two of the first semiconductor dies 100a, the package substrate 102 may not be large enough that these first semiconductor dies 100a could be attached side-by-side.

Referring to FIG. 1A, a back side S2 of the package substrate 102 has a concave CC. The concave CC is large enough to accommodate the second semiconductor die 100b. The concave CC has a surface RS recessed from a planar portion of the second side S2 of the package substrate 102. The semiconductor die 100b accommodated in the concave CC is attached to the recessed surface RS via a flip-chip bonding manner. The active surface AS of the second semiconductor die 100b faces toward the recessed surface RS, while the back surface BS of the second semiconductor die 100b faces away from the recessed surface RS. The electrical connectors CP at the active surface AS of the second semiconductor die 100b are attached to portions of the circuits 104 exposed at the recessed surface RS, so as to establish electrical connection between the integrated circuit in the second semiconductor die 100b and the circuits 104 in the package substrate 102. Further, since the second semiconductor die 100b is located in the concave CC, a sidewall of the second semiconductor die 100b faces toward a sidewall of the concave CC. In some embodiments, the attached second semiconductor die 100b is completely accommodated in the concave CC, rather than protruding out of the concave CC. In these embodiments, the sidewall of the second semiconductor die 100b may completely face toward the sidewall of the concave CC. In addition, a depth of the concave CC may be greater than a height of the second semiconductor die 100b, such that the back surface BS of the second semiconductor die 100b may be recess from the planar portion of the second side S2 of the package substrate 102. Alternatively, the depth of the concave CC may be substantially equal to the height of the second semiconductor die 100b, and the back surface BS of the second semiconductor die 100b may be substantially coplanar with the planar portion of the second side S2 of the package substrate 102. Further, in some embodiments, an underfill (not shown) spreads between the active surface AS of the second semiconductor die 100b and the recessed surface RS at the second side S2 of the package substrate 102, and laterally surrounds the electrical connectors CP of the second semiconductor die 100b.

Referring to FIG. 1A and FIG. 1C, in some embodiments, the concave CC at the second side S2 of the semiconductor package 10 is overlapped with the first semiconductor die 100a at the first side S1 of the semiconductor package 10. It should be noted that, since FIG. 1C depicts a configuration at the top side of the semiconductor package 10, the concave CC at the bottom side of the semiconductor package 10 is depicted by ghost lines in FIG. 1C. As shown in FIG. 1C, in some embodiments, a range (i.e., a footprint area) of the concave CC is greater than a footprint area of the first semiconductor die 100a, such that the first semiconductor die 100a is completely overlapped with the concave CC. In addition, as indicated in FIG. 1C, the second semiconductor die 100b may be completely overlapped with the first semiconductor die 100a (thus not shown in FIG. 1C). Alternatively, the second semiconductor die 100b may be partially overlapped with the first semiconductor die 100a, and a boundary of the second semiconductor die 100b may be laterally offset with respect to a boundary of the first semiconductor die 100a.

Figure 1D:
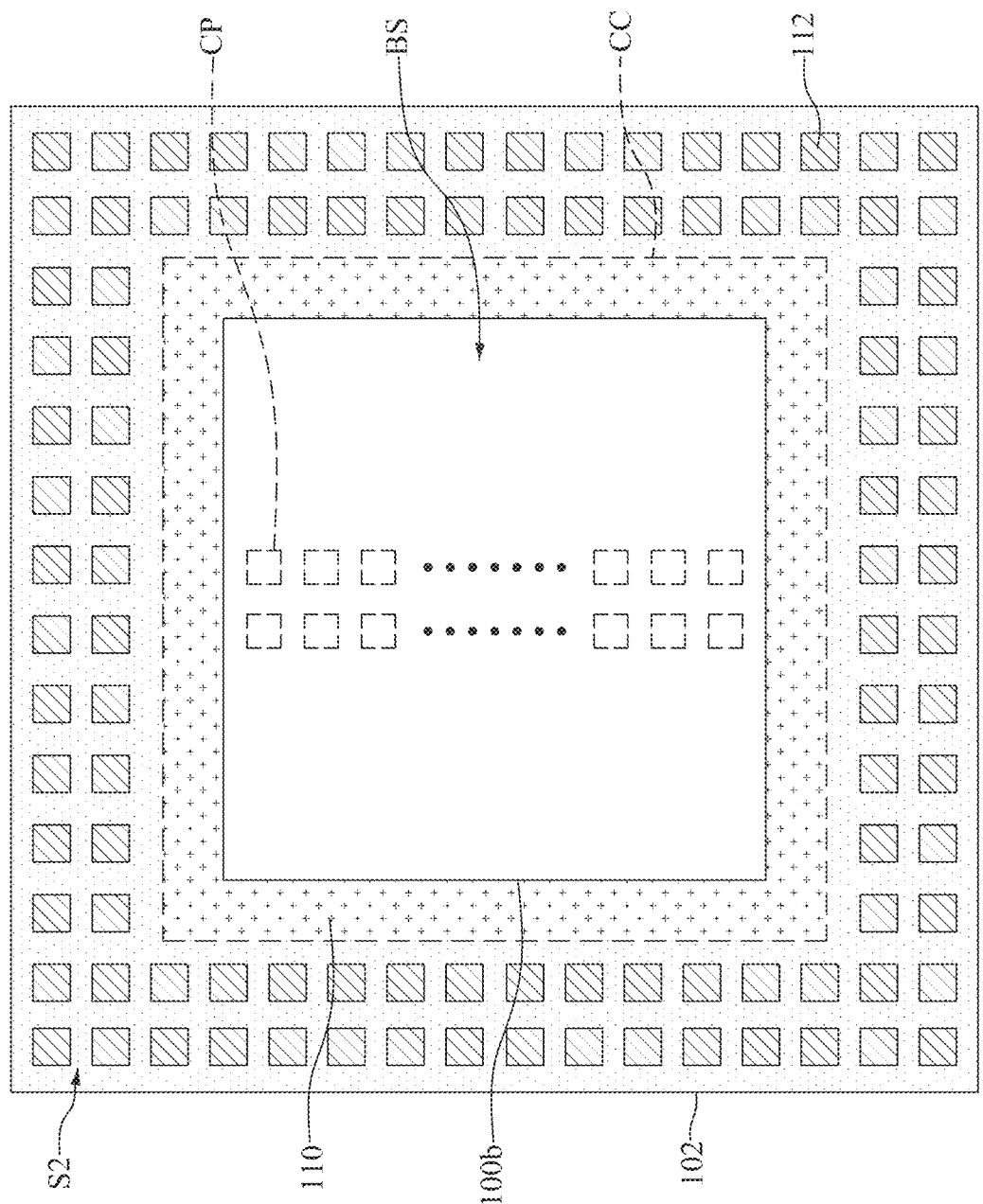
FIG. 1D is a schematic plan view illustrating a configuration of the second semiconductor die and the package substrate at a bottom side of the semiconductor package, according to some embodiments of the present disclosure.

FIG. 1D is a schematic plan view illustrating a configuration of the second semiconductor die 100b and the package substrate 102 at a bottom side of the semiconductor package 10, according to some embodiments of the present disclosure.

Referring to FIG. 1A and FIG. 1D, in those embodiments where the second semiconductor die 100b is attached to the recessed surface RS of the concave CC, the active surface AS of the second semiconductor die 100b faces away from the bottom side of the semiconductor package 10, thus the electrical connectors CP at the active surface AS of the second semiconductor die 100b are depicted by ghost lines. As shown in FIG. 1D, a footprint area of the concave CC is greater than a footprint area of the second semiconductor die 100b, and an edge of the second semiconductor die 100b is laterally spaced apart from an edge of the concave CC. Nevertheless, the concave CC may not be large enough to accommodate two of the second semiconductor dies 100b.

Referring to FIG. 1A, the first semiconductor die 100a is encapsulated by an encapsulant 108. The encapsulant 108 spans on the first side S1 of the package substrate 102, and laterally encapsulates the first semiconductor die 100a. In some embodiments, the encapsulant 108 is formed to a height greater than a thickness of the first semiconductor die 100a, such that the first semiconductor die 100a is overmolded by the encapsulant 108. In these embodiments, the back surface BS of the first semiconductor die 100a is covered by the encapsulant 108. Further, in some embodiments, the encapsulant 108 further extend along a sidewall of the package substrate 102. In these embodiments, the package substrate 102 is laterally encapsulated by the encapsulant 108, along with the first semiconductor die 100a. The encapsulant 108 may be formed of a polymer material. For instance, such polymer material may include epoxy resin, phenolic resin or the like.

It should be noted that, for conciseness, the encapsulant 108 is omitted from illustration in FIG. 1C. When viewing the top side of the semiconductor package 10, the first semiconductor die 100a and the package substrate 102 may actually be covered by the encapsulant 108.

Referring to FIG. 1A, the second semiconductor die 100b is encapsulated by an encapsulant 110. The concave CC is filled by the encapsulant 110, such that the second semiconductor 100b accommodated in the concave CC is wrapped by the encapsulant 110. In some embodiments, the encapsulant 110 may not extend along the planar portion of the second side S2 of the package substrate 102. In these embodiments, the second side S2 of the package substrate 102 is covered by the encapsulant 110 at the concave CC, while not being covered by the encapsulant 110 elsewhere. Further, the encapsulant 108 covering the first side S1 and the sidewall of the package substrate 102 may be physically separated from the encapsulant 110 filled in the concave CC at the second side S2 of the package substrate 102. In some embodiments, a bottom surface of the encapsulant 110 is substantially coplanar with the planar portion of the second side S2 of the package substrate 102. In those embodiments where the depth of the concave CC is greater than the height of the second semiconductor die 100b, the second semiconductor die 100b may be completely buried in the encapsulant 110, and the back surface BS of the second semiconductor die 100b may be covered by a bottom portion of the encapsulant 110. Alternatively, in those embodiments where the depth of the concave CC is substantially coplanar with the height of the second semiconductor die 100b, a bottom surface of the encapsulant 110 may be substantially coplanar with the back surface BS of the second semiconductor die 100b. As similar to the encapsulant 108, the encapsulant 110 may be formed of a polymer material, such as epoxy resin, phenolic resin or the like.

It should be noted that, although the encapsulant 110 is depicted as laterally surrounding the second semiconductor die 100b in FIG. 1D, the encapsulant 110 may alternatively cover the back surface BS of the second semiconductor die 100b, as described above.

Referring to FIG. 1A and FIG. 1D, in some embodiments, the semiconductor package 10 further includes electrical connectors 112. The electrical connectors 112 may be disposed at the second side S2 of the package substrate 102, and are electrically connected to the circuits 104 embedded in the package substrate 102. Accordingly, the integrated circuits in the first and second semiconductor dies 100a, 100b can be routed to the electrical connectors 112 through the circuits 104, and the electrical connectors 112 may be functioned as I/Os of the semiconductor package 10. In some embodiments, the electrical connectors 112 are disposed at the planar portion of the second side S2 of the package substrate 102. In these embodiments, the electrical connectors 112 are disposed around the concave CC, and the second semiconductor die 100b as well as the encapsulant 110 filled in the concave CC are laterally surrounded by the electrical connectors 112. The electrical connectors 112 may be bumps, conductive pillars, conductive pillar bumps or the like, the present disclosure is not limited to the type of the electrical connectors 112.

Since the first and second semiconductor dies 100a, 100b attached at opposite sides S1, S2 of the package substrate 102 are integrated in the semiconductor package 10, the semiconductor package 10 can be described as a dual-die package. Further, as compared to dual-die packages in which the semiconductor dies are disposed side-by-side or stacked on a single side of a package substrate, the semiconductor package 10 may provide the first and second semiconductor dies 100a, 100b with substantially consistent routing paths. Consequently, signal delay for certain semiconductor die with longer routing path can be avoided, and an operation frequency of the semiconductor package 10 can be further raised.

Figure 2:
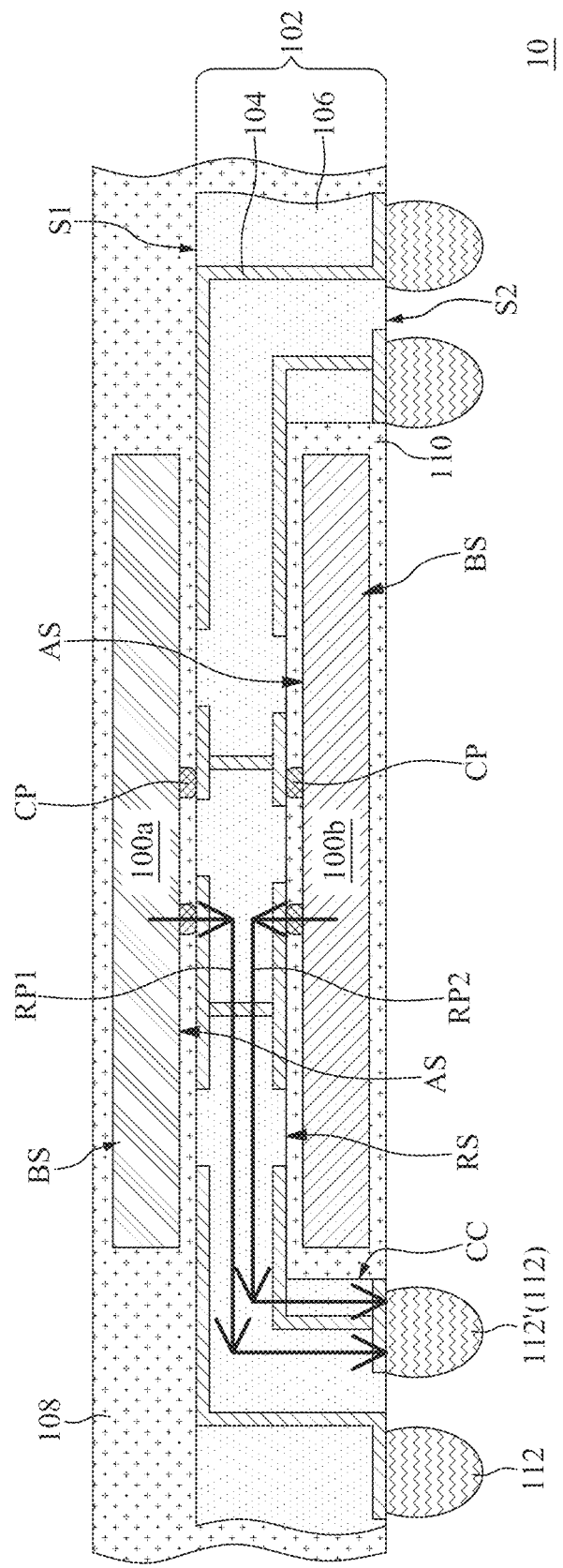
FIG. 2 is a schematic cross-sectional view of the semiconductor package with indication of routing paths extending from the first and second semiconductor dies to one of the electrical connectors, according to some embodiments of the present disclosure.

FIG. 2 is a schematic cross-sectional view of the semiconductor package 10 with indication of routing paths extending from the first and second semiconductor dies 100a, 100b to one of the electrical connectors 112, according to some embodiments of the present disclosure.

Referring to FIG. 2, as an example, the integrated circuit in the first semiconductor die 100a may be routed to one of the electrical connectors 112 (labeled as an electrical connector 112') along a routing path RP1, while the integrated circuit in the second semiconductor die 100b may be routed to this electrical connector 112' along a routing path RP2. When signals are transmitted from the first semiconductor die 100a to the electrical connector 112' along the routing path RP1, the signals initially go down to the circuits 104 in the package substrate 102 through one of the electrical connectors CP at the active surface AS of the first semiconductor die 100a, then laterally travel in the circuits 104, and are directed down to the electrical connector 112'. On the other hand, when signals are transmitted from the second semiconductor die 100b to the electrical connector 112' along the routing path RP2, the signals initially go up to the circuits 104 in the package substrate 102 through one of the electrical connectors CP at the active surface AS of the second semiconductor die 100b, then laterally travel in the circuits 104, and are directed down to the electrical connector 112'. Since the second semiconductor die 100b can be overlapped with the first semiconductor die 100a, a length of the lateral portion in the routing path RP1 can be equal to or slightly longer/shorter than a length of the lateral portion in the routing path RP2. Further, since the first semiconductor die 100a is disposed at the first side S1 of the package substrate 102 and the second semiconductor die 100b is disposed in the concave CC at the second side S2 of the package substrate 102, the routing paths RP1, RP2 can be more easily adjusted to have vertical portions with substantially identical height. Consequently, the routing paths RP1, RP2 can be designed with substantially identical distance, and routing inconsistency of the first and second semiconductor dies 100a, 100b can be effectively reduced.

Figure 3:
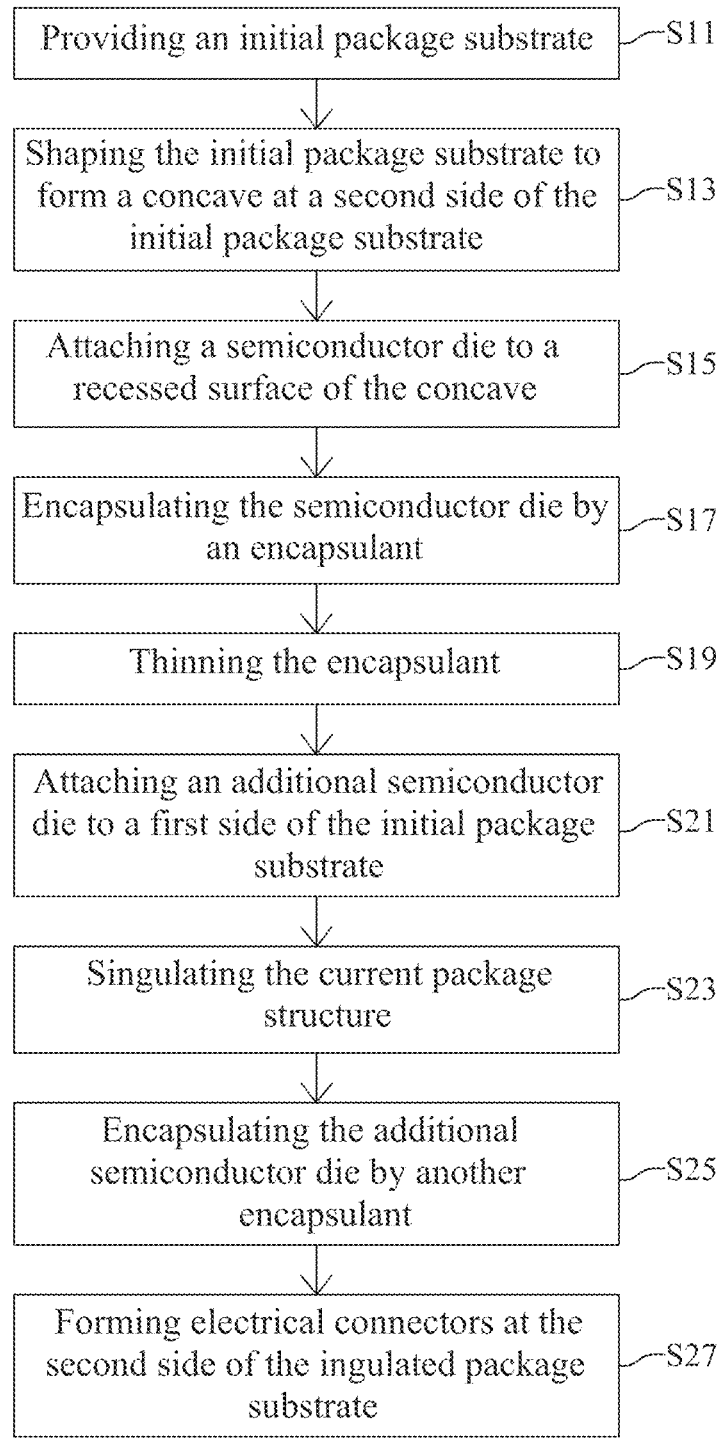
FIG. 3 is a flow diagram illustrating a manufacturing method for forming the semiconductor package, according to some embodiments of the present disclosure.

FIG. 3 is a flow diagram illustrating a manufacturing method for forming the semiconductor package 10, according to some embodiments of the present disclosure. FIG. 4A through FIG. 4H are schematic cross-sectional views illustrating intermediate structures at various stages during the manufacturing process shown in FIG. 3.

Figure 4A:
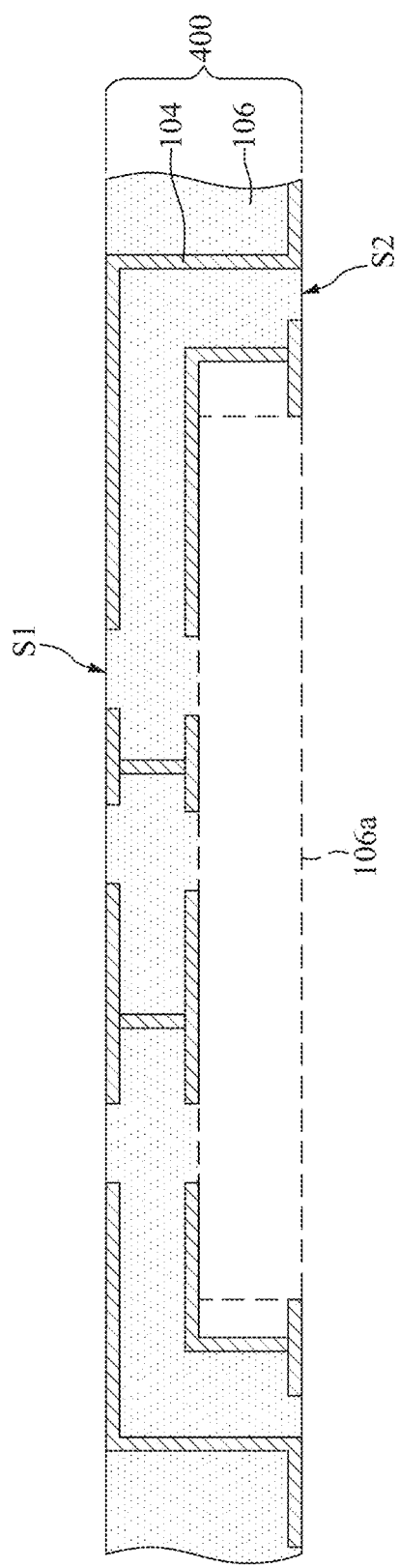
FIG. 4A through FIG. 4H are schematic cross-sectional views illustrating intermediate structures at various stages during the manufacturing process shown in FIG. 3.

Referring to FIG. 3 and FIG. 4A, step S11 is performed, and an initial package substrate 400 is provided. The initial package substrate 400 will be shaped and singulated to form the package substrate 102 as described with reference to FIG. 1A, and includes a stack of the dielectric layers 106 as well as the circuits 104 spreading in the stack of the dielectric layers 106. A portion 106a of the stack of the dielectric layer 106 close to the second side S2 of the initial package substrate 400 may be free of the circuits 104, and will be removed to form the concave CC as described with reference to FIG. 1A.

Figure 4B:
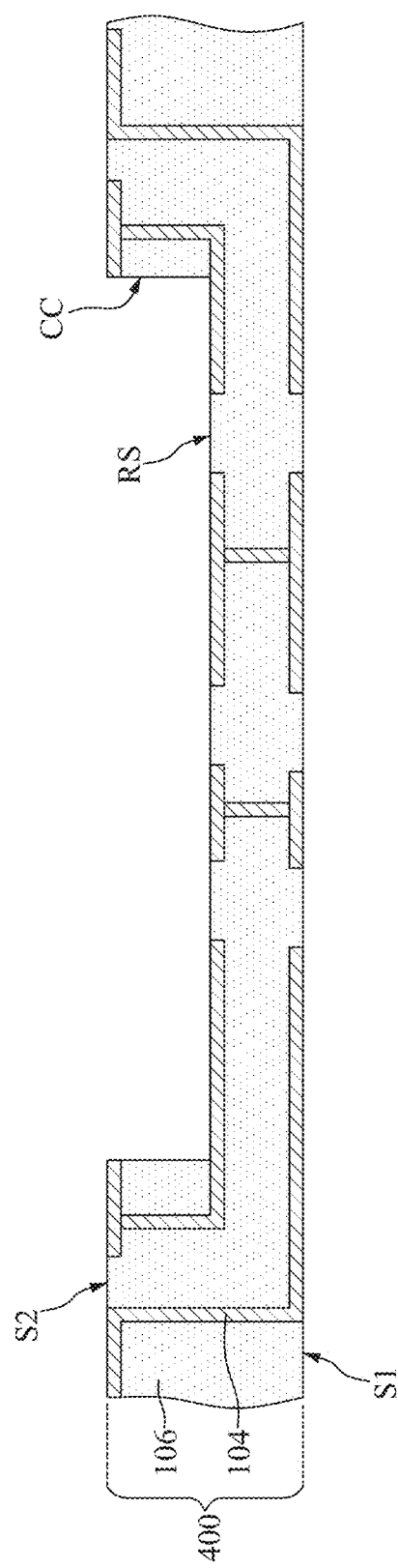

Referring to FIG. 3 and FIG. 4B, step S13 is performed, and the initial package substrate 400 is shaped to form the concave CC as described with reference to FIG. 1A. The portion 106a of the stack of the dielectric layers 106 may be removed during the shaping process. In some embodiments, the removal of the portion 106a of the stack of the dielectric layers 106 includes a laser process. In addition, in some embodiments, the second side S2 faces up during the removal of the portion 106a of the stack of the dielectric layers 106. Moreover, in some embodiments, the initial package substrate 400 is support by a carrier (not shown) during the removal process.

Figure 4C:
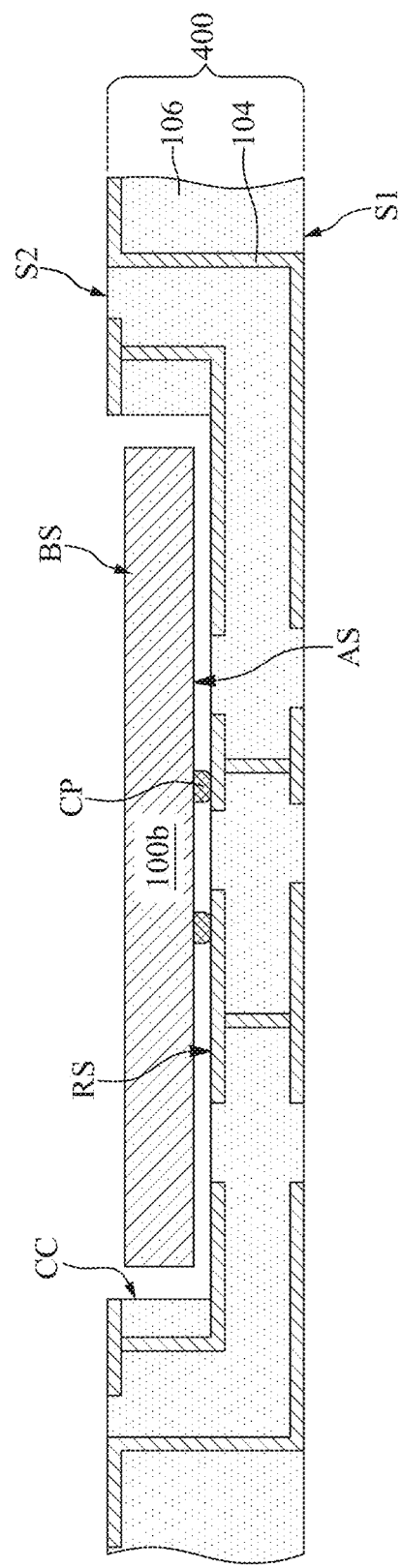

Referring to FIG. 3 and FIG. 4C, step S15 is performed, and the second semiconductor die 100b is attached to the recessed surface RS of the concave CC. In some embodiments, the second semiconductor die 100b is attached to the recessed surface RS via a flip-chip bonding manner In these embodiments, the active surface AS of the attached second semiconductor die 100b faces toward the recessed surface RS, and the electrical connectors CP at the active surface AS are attached to portions of the circuits 104 exposed at the recessed surface RS. During a flip-chip bonding process, the second semiconductor die 100b may be placed on the recessed surface RS via a pick-and-place (PNP) apparatus, then a thermal treatment may be performed for bonding the second semiconductor die 100b to the recessed surface RS. In some embodiments, an underfill (not shown) is provided to fill a space between the second semiconductor die 100b and the recessed surface RS, and the electrical connectors CP at the active surface AS of the second semiconductor die 100b may be laterally surrounded by the underfill.

Figure 4D:
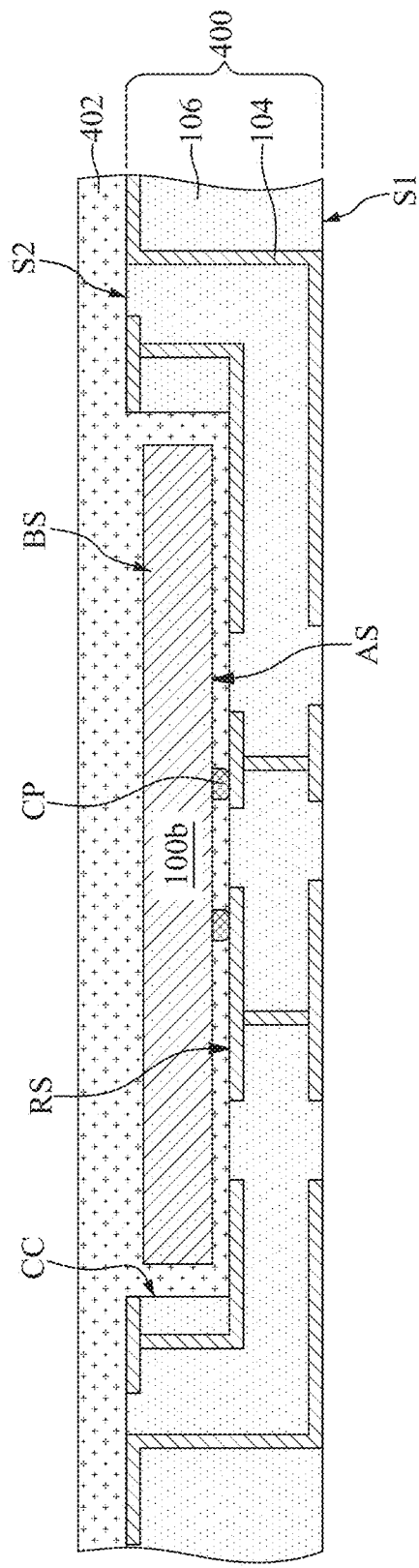

Referring to FIG. 3 and FIG. 4D, step S17 is performed, and the second semiconductor die 100b is encapsulated by an encapsulant 402. The encapsulant 402 will be thinned to form the encapsulant 110 as described with reference to FIG. 1A. Currently, the encapsulant 402 fills up the remaining space in the concave CC, and may extend onto the planar portion of the second side S2 of the initial package substrate 400.

Figure 4E:
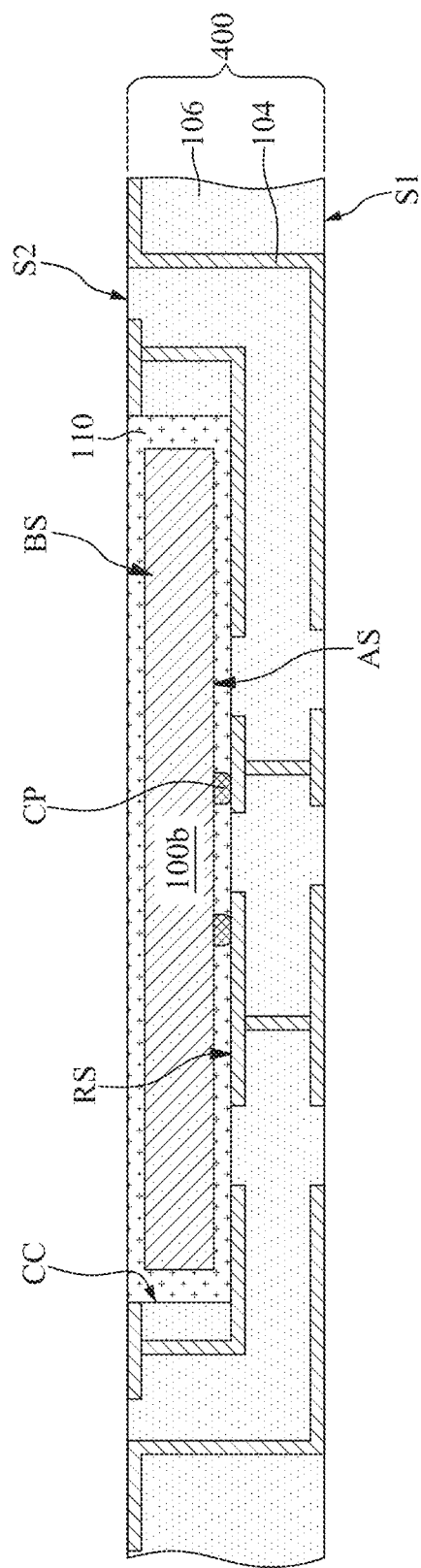

Referring to FIG. 3 and FIG. 4E, step S19 is performed, and the encapsulant 402 is thinned to form the encapsulant 110 as described with reference to FIG. 1A. During the thinning process, a portion of the encapsulant 402 above the planar portion of the second side S2 of the initial package substrate 400 is removed. Accordingly, the planar portion of the second side S2 of the initial package substrate 400 is currently exposed, while the concave CC is remained filled. In some embodiments, a method for thinning the encapsulant 402 includes a planarization process. For instance, the planarization process includes a polishing process, an etching process or a combination thereof.

Figure 4F:
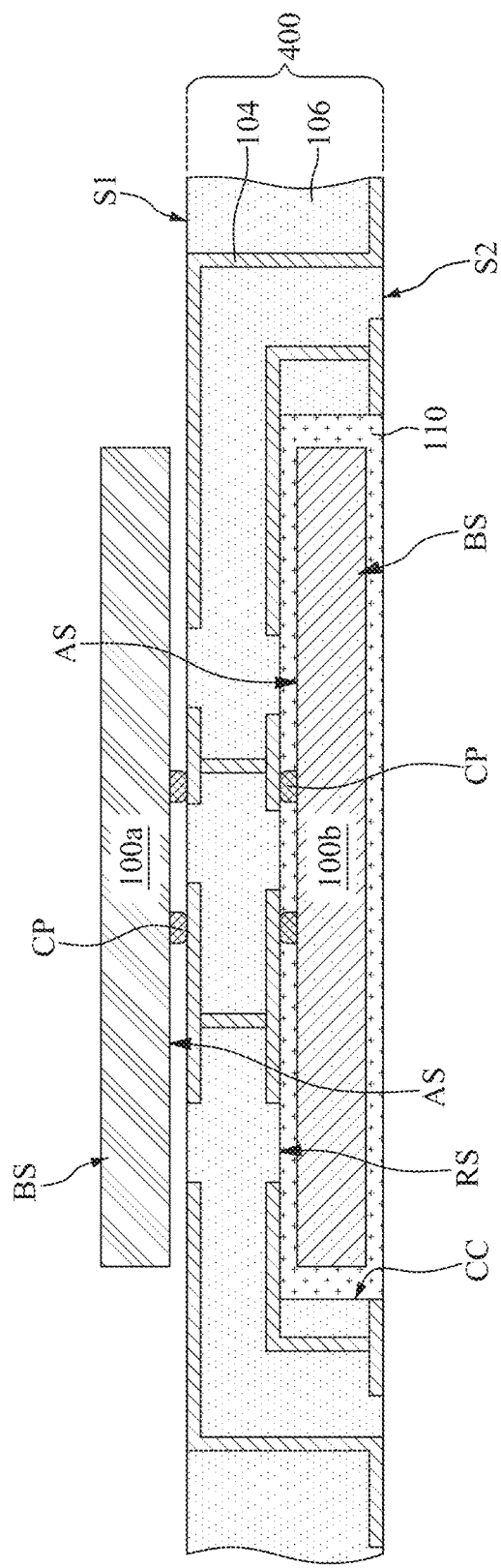

Referring to FIG. 3 and FIG. 4F, step S21 is performed, and the first semiconductor die 100a is attached to the first side S1 of the initial package substrate 400. In some embodiments, before the attachment of the first semiconductor die 100a, the initial package substrate 400 attached with the second semiconductor die 100b may be released from the possible carrier (not shown) at the first side S1 of the initial package substrate 400, and may be flipped over, such that the first side S1 of the initial package substrate 400 may face up. Further, the second side S2 of the flipped initial package substrate 400 may be supported by another carrier (not shown). In some embodiments, the first semiconductor die 100a is attached to the first side S1 of the initial package substrate 400 via a flip-chip bonding manner In these embodiments, the active surface AS of the attached first semiconductor die 100a faces toward the first side S1 of the initial package substrate 400, and the electrical connectors CP at the active surface AS are attached to portions of the circuits 104 exposed at the first side S1 of the initial package substrate 400. During a flip-chip bonding process, the first semiconductor die 100a may be placed on the first side S1 of the initial package substrate 400 via a PNP apparatus, then a thermal treatment may be performed for bonding the first semiconductor die 100a to the first side S1 of the initial package substrate 400. In some embodiments, an underfill (not shown) is provided to fill a space between the first semiconductor die 100a and the first side S1 of the initial package substrate 400, and the electrical connectors CP at the active surface AS of the first semiconductor die 100a may be laterally surrounded by the underfill.

Figure 4G:
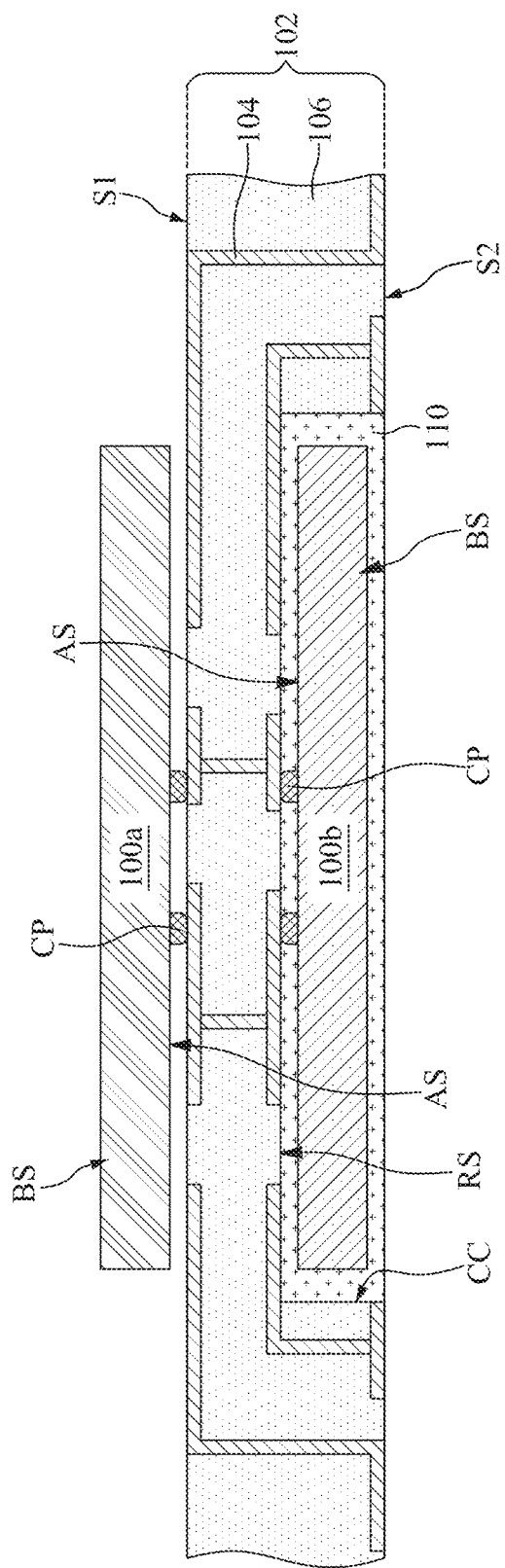

Referring to FIG. 3 and FIG. 4G, step S23 is performed, and the initial package substrate 400 is singulated to form the package substrate 102 as described with reference to FIG. 1A, FIG. 1C and FIG. 1D. In some embodiments, the singulation includes a blade sawing process, a laser dicing process or the like.

Figure 4H:
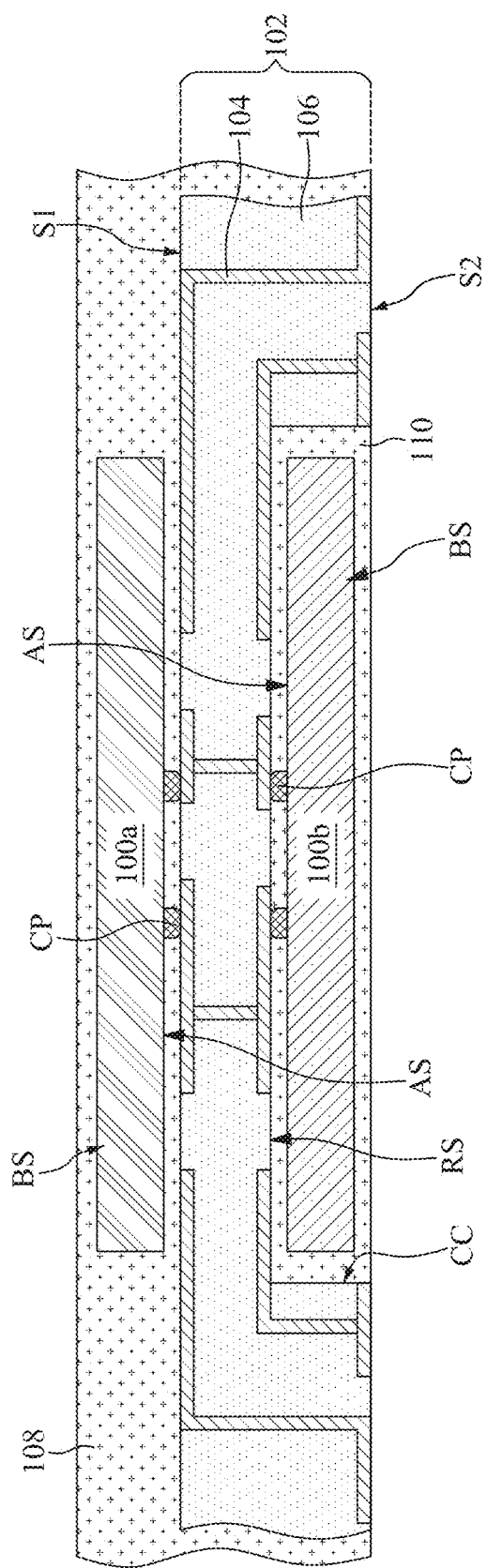

Referring to FIG. 3 and FIG. 4H, step S25 is performed, and the first semiconductor die 100a is encapsulated by the encapsulant 108. As described with reference to FIG. 1A, the encapsulant 108 may laterally surround the first semiconductor die 100a as well as the optional underfill (not shown) filled between the first semiconductor die 100a and the package substrate 102. In some embodiments, the first semiconductor die 100a is over-molded by the encapsulant 108, and the back surface BS of the first semiconductor die 100a is covered by a top portion of the encapsulant 108. In addition, in some embodiments, the encapsulant 108 may further extend along a sidewall of the package substrate 102, such that the package substrate 102 is also laterally encapsulated by the encapsulant 108.

Referring to FIG. 3A and FIG. 1A, step S27 is performed, and the electrical connectors 112 are formed at the second side S2 of the package substrate 102. In some embodiments, before the formation of the electrical connectors 112, the current package structure may be released from the possible carrier (not shown) at the second side S2 of the package substrate 102, then flipped over, such that the second side S2 of the package substrate 102 faces up. Subsequently, the electrical connectors 112 are formed within the planar portion of the second side S2 of the package substrate 102.

Up to here, the semiconductor package 10 has been formed. The semiconductor package 10 may be further bonded to another package component through the electrical connectors 112.

Figure 5:
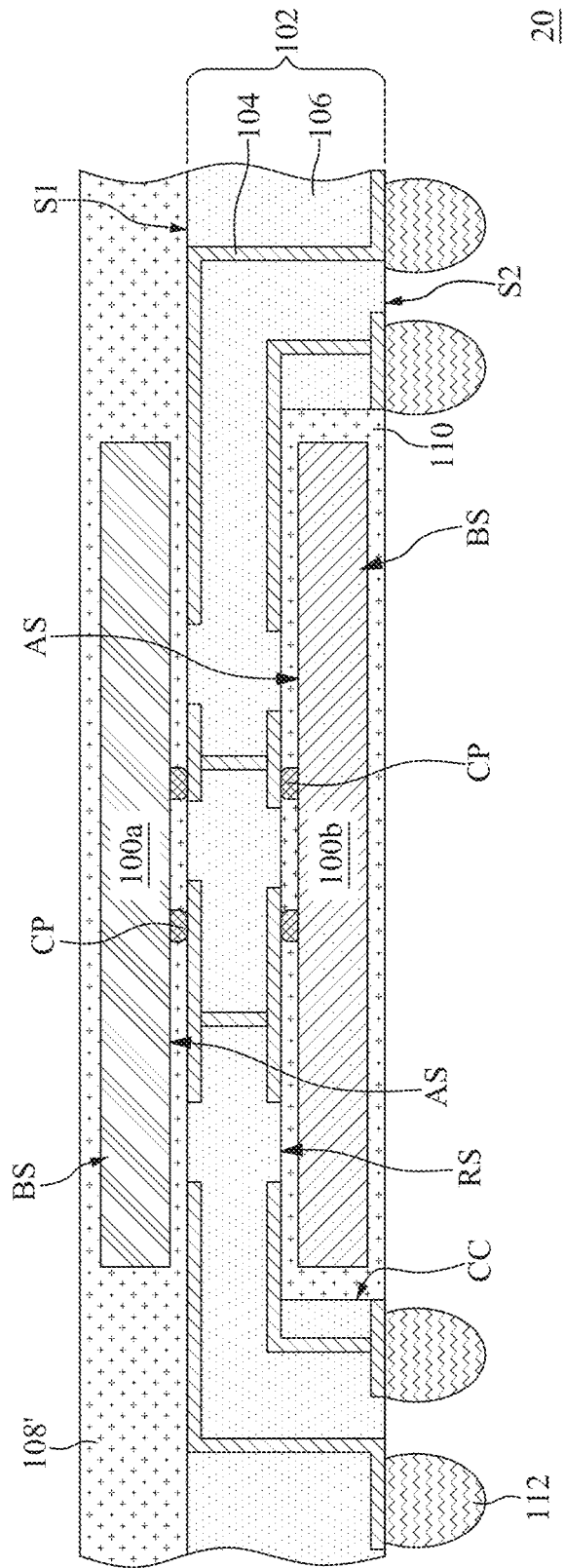
FIG. 5 is a schematic cross-sectional view illustrating a semiconductor package according to some embodiments of the present disclosure.

FIG. 5 is a schematic cross-sectional view illustrating a semiconductor package 20 according to some embodiments of the present disclosure. The semiconductor package 20 is similar to the semiconductor package 10 as described with reference to FIG. 1A. Only differences between the semiconductor packages 10, 20 will be described, the same or the like parts would not be repeated again. In addition, the like numeral references indicate similar components (e.g., the encapsulant 108 as shown in FIG. 1A and the encapsulant 108' as shown in FIG. 5).

Referring to FIG. 5, in some embodiments, the encapsulant 108' encapsulating the first semiconductor die 100a may not cover a sidewall of the package substrate 102. In these embodiments, a sidewall of the encapsulant 108' may be substantially coplanar with the sidewall of the package substrate 102.

Figure 6:
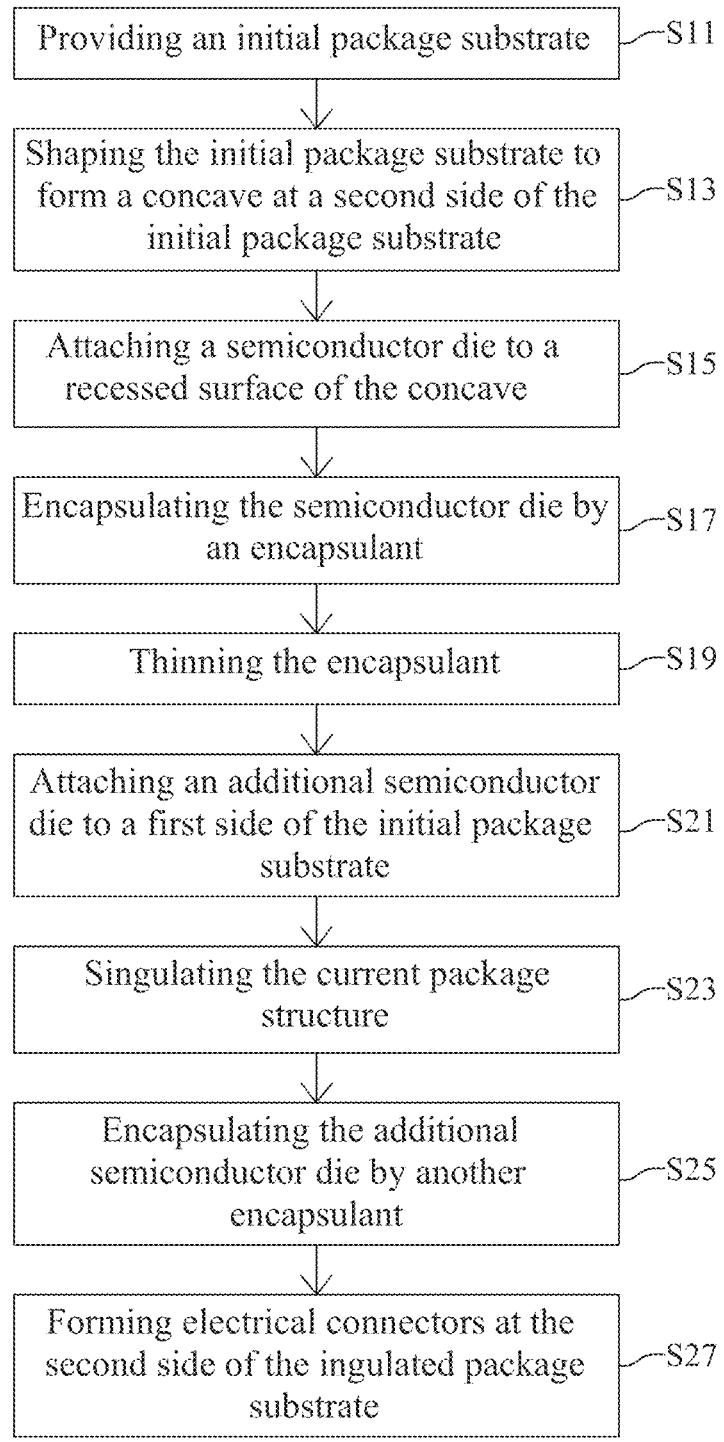
FIG. 6 is a flow diagram illustrating a manufacturing method for forming the semiconductor package, according to some embodiments of the present disclosure.
Figure 7A:
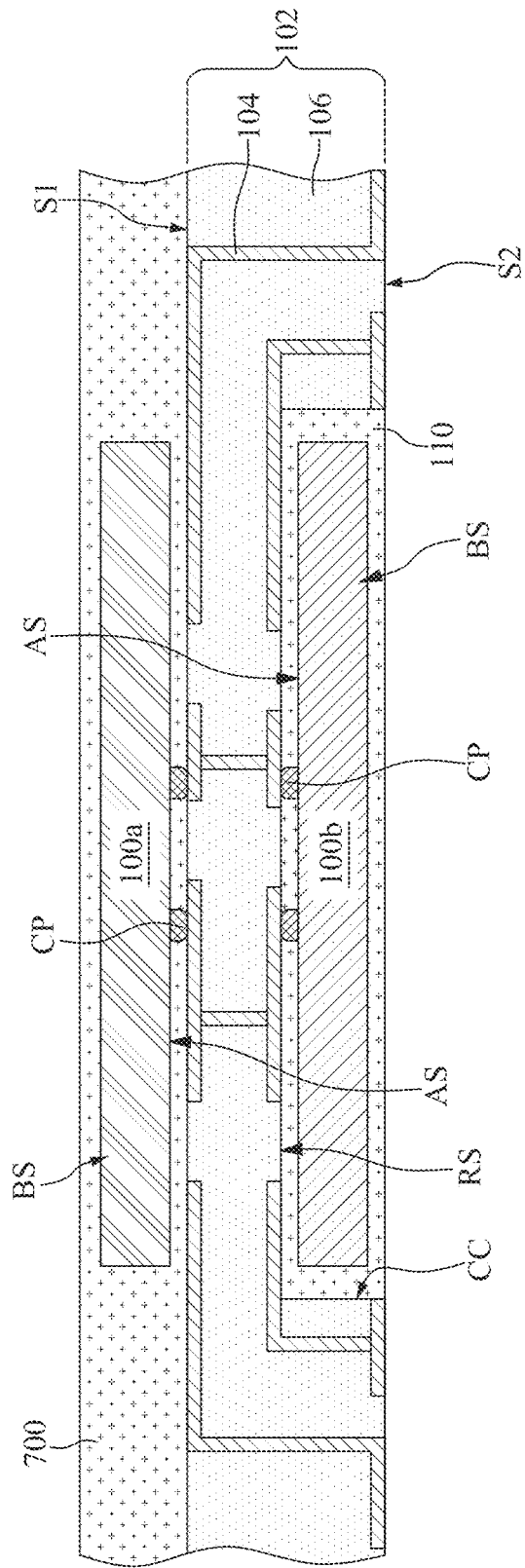
FIG. 7A through FIG. 7B are schematic cross-sectional views illustrating intermediate structures at various stages during the manufacturing process shown in FIG. 6.
Figure 7B:
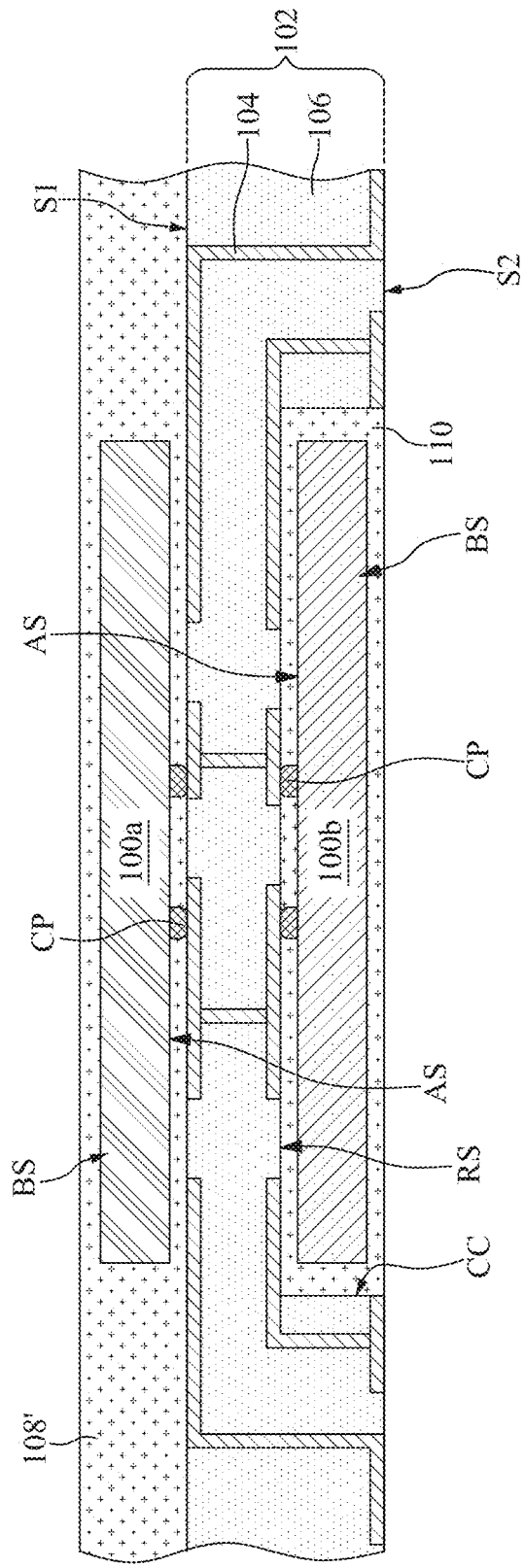

FIG. 6 is a flow diagram illustrating a manufacturing method for forming the semiconductor package 20, according to some embodiments of the present disclosure. FIG. 7A through FIG. 7B are schematic cross-sectional views illustrating intermediate structures at various stages during the manufacturing process shown in FIG. 6.

Referring to FIG. 6, the manufacturing process may begin with the steps S11, S13, S15 S17, S19 and S21 as described with reference to FIG. 3 and FIG. 4A through FIG. 4F. Up to here, the first semiconductor die 100a has been attached to the first side S1 of the initial package substrate 400.

Instead of performing the step S23 for singulating the initial package substrate 400, the step S25 may be performed to encapsulate the first semiconductor die 100a with an encapsulant 700 as shown in FIG. 7A. The encapsulant 700 may be provided on the first side S1 of the initial package substrate 400, and may laterally surround the first semiconductor die 100a as well as the optional underfill (not shown) filled between the first semiconductor die 100a and the package substrate 102. In some embodiments, the first semiconductor die 100a is over-molded by the encapsulant 700, and the back surface BS of the first semiconductor die 100a is covered by a top portion of the encapsulant 700.

Referring to FIG. 6 and FIG. 7B, step S23 is performed, and the current package structure is singulated. Since the encapsulant 700 has been formed on the initial package substrate 400, the encapsulant 700 and the initial package substrate 400 may be singulated simultaneously. The encapsulant 700 is singulated to form the encapsulant 108', and the initial package substrate 400 is singulated to form the package substrate 102.

Subsequently, step S27 is performed, and the electrical connectors 112 are formed at the planar portion of the second side S2 of the package substrate 102 to form the semiconductor package 20 as described with reference to FIG. 5.

Figure 8A:
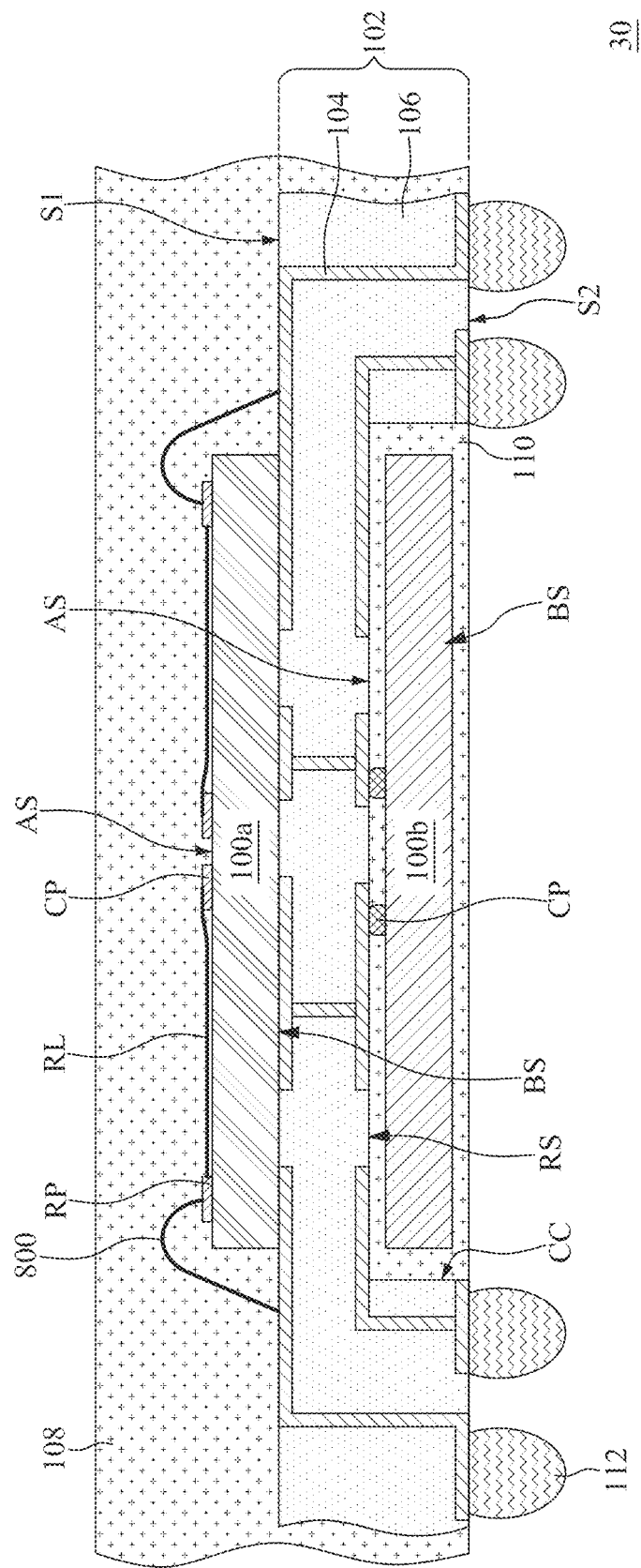
FIG. 8A is a schematic cross-sectional view illustrating a semiconductor package according to some embodiments of the present disclosure.

FIG. 8A is a schematic cross-sectional view illustrating a semiconductor package 30 according to some embodiments of the present disclosure. The semiconductor package 30 is similar to the semiconductor package 10 as described with reference to FIG. 1A. Only differences between the semiconductor packages 10, 30 will be described, the same or the like parts would not be repeated again.

Referring to FIG. 8A, in some embodiments, the first semiconductor die 100a is bonded to the first side S1 of the package substrate 102 via a wire bonding manner In these embodiments, the back surface BS of the first semiconductor die 100a faces toward the first side S1 of the package substrate 102, while the active surface AS of the first semiconductor die 100a faces away from the first side S1 of the package substrate 102. In addition, the electrical connectors CP at the active surface AS of the first semiconductor die 100a may be routed to portions of the circuits 104 exposed at the first side S1 of the package substrate 102 through bonding wires 800. The bonding wires 800 may be formed after the attachment of the first semiconductor die 100a, and is formed of a conductive material, such as gold or gold alloy.

Figure 8B:
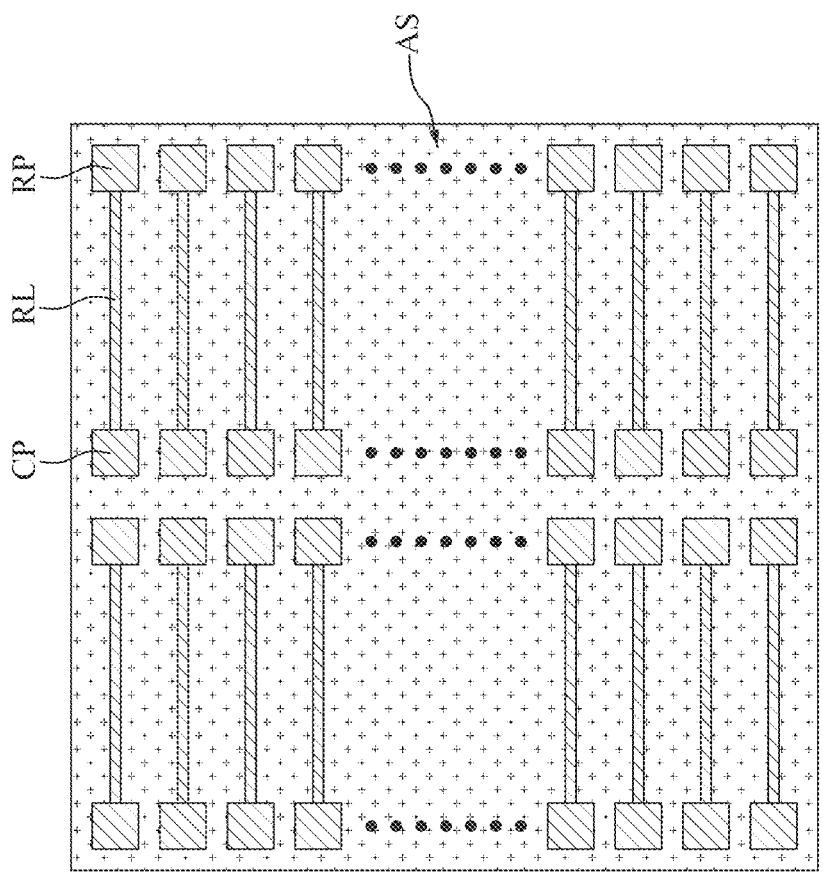
FIG. 8B is a schematic plan view illustrating the active surface of the first semiconductor die in the semiconductor package as shown in FIG. 8A, according to some embodiments of the present disclosure.

FIG. 8B is a schematic plan view illustrating the active surface AS of the first semiconductor die 100a in the semiconductor package 30, according to some embodiments of the present disclosure.

Referring to FIG. 8A and FIG. 8B, in those embodiments where the electrical connectors CP are formed within a central region of the active surface AS of the first semiconductor die 100a, the first semiconductor die 100a may further include redistribution lines RL and redistribution pads RP at the active surface AS. The redistribution pads RP are arranged along edges of the active surface AS of the first semiconductor die 100a (e.g., left and right edges of the active surface AS as shown in FIG. 8B). The redistribution lines RL respectively extend between one of the electrical connectors CP and a corresponding one of the redistribution pads RP, in order to establish electrical connection between the electrical connectors CP and the redistribution pads RP.

By disposing the redistribution lines RL and the redistribution pads RP, the electrical connectors CP can be routed to edges of the active surface AS of the first semiconductor die 100a. As shown in FIG. 8A, the bonding wires 800 may extend from the redistribution pads RP to the portions of the circuits 104 exposed at the first side S1 of the package substrate 102.

The semiconductor package 30 is depicted as having the encapsulant 108 further extending along the sidewall of the package substrate 102. However, in alternative embodiments, the encapsulant 108 may be replaced by the encapsulant 108' as described with reference to FIG. 5, such that the sidewall of the package substrate 102 may be substantially coplanar with the sidewall of the encapsulant 108'.

As above, the first and second semiconductor dies attached at opposite sides of the package substrate are integrated in the semiconductor package, the semiconductor package can be described as a dual-die package. Further, as compared to dual-die packages in which the semiconductor dies are disposed side-by-side or stacked on a single side of a package substrate, the semiconductor package according to embodiments of the present disclosure may provide the first and second semiconductor dies with substantially consistent routing paths. Consequently, signal delay for certain semiconductor die with longer routing path can be avoided, and an operation frequency of the semiconductor package can be further raised.

In an aspect of the present disclosure, a semiconductor package is provided. The semiconductor package comprises: a package substrate with a first side and a second side facing away from the first side, wherein the second side has a concave recessed from a planar portion of the second side; a first semiconductor die, attached to the first side of the package substrate; a second semiconductor die, attached to a recessed surface of the concave; a first encapsulant, covering the first side of the package substrate and encapsulating the first semiconductor die; and a second encapsulant, filling up the concave and encapsulating the second semiconductor die.

In another aspect of the present disclosure, a semiconductor package is provided. The semiconductor package comprises: a package substrate with a first side and a second side facing away from the first side, wherein the second side has a concave recessed from a planar portion of the second side; a first semiconductor die, attached to the first side of the package substrate, wherein an active surface of the first semiconductor die faces toward the package substrate; and a second semiconductor die, attached to a recessed surface of the concave and overlapped with the first semiconductor die, wherein an active surface of the second semiconductor die faces toward the recessed surface of the second side of the package substrate.

In yet another aspect of the present disclosure, a manufacturing method of a semiconductor package is provided. The method comprises: providing a package substrate with a first side and a second side opposite to the first side; removing a portion of the package substrate from the second side, to form a concave having a recessed surface recessed from a planar portion of the second side of the package substrate; attaching a first semiconductor die to the first side of the package substrate; attaching a second semiconductor die to the recessed surface of the concave; encapsulating the first semiconductor die with a first encapsulant; and filling a second encapsulant into the concave to encapsulate the second semiconductor die.

Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein, may be utilized according to the present disclosure. Accordingly, the appended claims are intended to include within their scope such processes, machines, manufacture, compositions of matter, means, methods, and steps.

What is claimed is:

1. A semiconductor package, comprising:
   a package substrate with a first side and a second side facing away from the first side, wherein the second side has a concave recessed from a planar portion of the second side;
   a first semiconductor die, attached to the first side of the package substrate;
   a second semiconductor die, attached to a recessed surface of the concave;
   a first encapsulant, covering the first side of the package substrate and encapsulating the first semiconductor die; and
   a second encapsulant, filling up the concave and encapsulating the second semiconductor die.

2. The semiconductor package according to claim 1, wherein the first semiconductor die is overlapped with the second semiconductor die.

3. The semiconductor package according to claim 1, wherein a depth of the concave is greater than a height of the second semiconductor die.

4. The semiconductor package according to claim 3, wherein a bottom surface of the second semiconductor die is recessed from the planar portion of the second side of the package substrate, and covered by a bottom portion of the second encapsulant.

5. The semiconductor package according to claim 1, wherein a depth of the concave is substantially equal to a height of the second semiconductor die.

6. The semiconductor package according to claim 5, wherein a bottom surface of the second semiconductor die is substantially coplanar with a bottom surface of the second encapsulant as well as the planar portion of the second side of the package substrate.

7. The semiconductor package according to claim 1, further comprising:
   electrical connectors, disposed at the planar portion of the second side of the package substrate.

8. The semiconductor package according to claim 7, wherein the second encapsulant and the second semiconductor die are laterally surrounded by the electrical connectors.

9. The semiconductor package according to claim 1, wherein the first encapsulant further extend along a sidewall of the package substrate.

10. The semiconductor package according to claim 1, wherein a sidewall of the first encapsulant is substantially coplanar with a sidewall of the package substrate.

11. A semiconductor package, comprising:
    a package substrate with a first side and a second side facing away from the first side, wherein the second side has a concave recessed from a planar portion of the second side;
    a first semiconductor die, attached to the first side of the package substrate, wherein an active surface of the first semiconductor die faces toward the package substrate; and
    a second semiconductor die, attached to a recessed surface of the concave and overlapped with the first semiconductor die, wherein an active surface of the second semiconductor die faces toward the recessed surface of the second side of the package substrate.

12. The semiconductor package according to claim 11, wherein electrical connectors at the active surface of the first semiconductor die are attached to the first side of the package substrate.

13. The semiconductor package according to claim 11, wherein electrical connectors at the active surface of the second semiconductor die are attached to the recessed surface of the second side of the package substrate.

14. A manufacturing method of a semiconductor package, comprising:
    providing a package substrate with a first side and a second side opposite to the first side;
    removing a portion of the package substrate from the second side, to form a concave having a recessed surface recessed from a planar portion of the second side of the package substrate;
    attaching a first semiconductor die to the first side of the package substrate;
    attaching a second semiconductor die to the recessed surface of the concave;
    encapsulating the first semiconductor die with a first encapsulant; and
    filling a second encapsulant into the concave to encapsulate the second semiconductor die.

15. The manufacturing method of the semiconductor package according to claim 14, wherein the first semiconductor die and the second semiconductor die are respectively attached to the package substrate via a flip-chip bonding manner.

16. The manufacturing method of the semiconductor package according to claim 14, further comprising:
    singulating the package substrate before formation of the first encapsulant.

17. The manufacturing method of the semiconductor package according to claim 14, further comprising:
    singulating the first encapsulant and the package substrate after formation of the first encapsulant.

18. The manufacturing method of the semiconductor package according to claim 14, wherein attachment of the second semiconductor die and formation of the second encapsulant are performed before attachment of the first semiconductor die and formation of the first encapsulant.

19. The manufacturing method of the semiconductor package according to claim 14, further comprising:
    forming electrical connectors at the planar portion of the second side of the package substrate.

20. The manufacturing method of the semiconductor package according to claim 14, wherein the first semiconductor die is attached to a region of the first side of the package substrate overlapped with the concave at the second side of the package substrate.

* * * * *